(12) United States Patent
Karpur et al.

(10) Patent No.: US 8,502,400 B2
(45) Date of Patent: Aug. 6, 2013

(54) METHODS AND APPARATUSES TO STIFFEN INTEGRATED CIRCUIT PACKAGE

(75) Inventors: Prasanna Karpur, Chandler, AZ (US); Sriram Muthukumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/413,616

(22) Filed: Mar. 6, 2012

(65) Prior Publication Data

US 2012/0187583 A1 Jul. 26, 2012

Related U.S. Application Data

(62) Division of application No. 12/646,363, filed on Dec. 23, 2009, now Pat. No. 8,143,110.

(51) Int. Cl.
*H01L 23/29* (2006.01)
*H01L 23/48* (2006.01)

(52) U.S. Cl.
USPC ........... 257/790; 257/787; 257/783; 257/778; 257/E23.134

(58) Field of Classification Search
USPC ................... 257/790, 787, 783, 778, E23.134
See application file for complete search history.

(56) References Cited

U.S. PATENT DOCUMENTS

| | | | |
|---|---|---|---|
| 4,814,943 A * | 3/1989 | Okuaki | 361/783 |
| 4,843,046 A | 6/1989 | Yamaguchi et al. | |
| 5,336,931 A | 8/1994 | Juskey et al. | |
| 5,386,342 A * | 1/1995 | Rostoker | 361/749 |
| 5,436,203 A * | 7/1995 | Lin | 29/841 |
| 5,885,854 A * | 3/1999 | Wensel | 438/127 |
| 5,929,512 A | 7/1999 | Jacobs | |
| 5,936,310 A | 8/1999 | Wensel | |
| 6,071,761 A | 6/2000 | Jacobs | |
| 6,214,640 B1 | 4/2001 | Fosberry et al. | |
| 6,228,679 B1 * | 5/2001 | Chiu | 438/108 |
| 6,459,144 B1 * | 10/2002 | Pu et al. | 257/667 |
| 6,900,531 B2 | 5/2005 | Foong et al. | |
| 6,940,182 B2 | 9/2005 | Hilton et al. | |
| 6,959,489 B2 | 11/2005 | Beroz et al. | |
| 7,049,174 B2 | 5/2006 | Sakaba et al. | |
| 7,239,023 B2 * | 7/2007 | Yu-Tung et al. | 257/778 |
| 7,728,440 B2 * | 6/2010 | Honda | 257/778 |
| 8,106,521 B2 * | 1/2012 | Iwase et al. | 257/783 |
| 2001/0000927 A1 | 5/2001 | Rodenbeck et al. | |
| 2002/0168798 A1 | 11/2002 | Glenn et al. | |
| 2003/0090006 A1 | 5/2003 | Farnworth | |
| 2004/0166607 A1 | 8/2004 | Grigg | |
| 2008/0284047 A1 * | 11/2008 | Tosaya et al. | 257/787 |

* cited by examiner

*Primary Examiner* — Nitin Parekh

(74) *Attorney, Agent, or Firm* — Blakely, Sokoloff, Taylor & Zafman LLP

(57) ABSTRACT

A dam stiffener for a package substrate is presented. In an embodiment, the dam stiffener comprises a thermally curable polymer, and is simultaneously cured with the underfill material to act as stiffener to the substrate. In another embodiment, a curable reservoir material can be dispensed to fill the space between the integrated circuit die and the dam stiffener, forming a thick reservoir layer, acting as an additional stiffener for the package substrate.

15 Claims, 14 Drawing Sheets

METHODS AND APPARATUSES TO STIFFEN INTEGRATED CIRCUIT PACKAGE

This is a Divisional application Ser. No. 12/646,363 filed Dec. 23, 2009, which is presently pending.

FIELD OF THE INVENTION

This invention relates generally to packaging of integrated circuits. More specifically, this invention relates to a stiffener for a package substrate.

BACKGROUNDS AND RELATED ARTS

Integrated circuits are formed on a semiconductor die and packaged for incorporation into a variety of end products. Packaging integrated circuits typically includes placing a die on a substrate and forming electrical connections between input-output (I/O) pads on the die and conductive traces on the substrate.

Flip-chip package is a well-known type of integrated circuit package, comprising a flip chip coupled to a substrate through an array of conductive bumps and an underfill material that fills the gap between the chip and the substrate and encapsulates the conductive bumps. An array of solder balls are provided on another surface of the substrate and serves as input/output connections for the package. In order to prevent warpage, the substrate is typically a thick substrate, with a thickness of about 1.2 mm with a 0.8 mm core.

In recent years, thin core and coreless substrates have emerged to address the high electrical performance required for advanced electronic products. Thus, thin core substrate of 0.4 mm or 0.2 mm, and also coreless substrates have been used. Such substrates improve the electrical performance of a package by reducing the lengths and distances of circuit paths and electrical connections.

However, thin core or coreless substrates are subject to warpage during the assembly and test manufacturing process, leading to poor contacts between the substrate and the conductive bumps, or cracks of the conductive bumps, thereby degrading the electrical contact and the product quality. Thus, to enable a package to survive such handling, as well as other stresses in the use environment of the package, stiffeners often are attached to substrates.

FIGS. 1A and 1B (Prior Art) illustrate a perspective view and a cross section view, respectively, of a prior art package stiffening by attaching a metal ring on a peripheral portion of the substrate. The package includes a semiconductor die 11 attached to a substrate 13 through an array of conductive bumps and secured with an underfill 14. Capacitors 12 can also be distributed around the semiconductor die, for example, to store energy to accommodate electrical power ramping. A metal stiffener 10, typically comprising a metal piece with a cutout in the middle, is glued to the substrate 13 to provide stability to substrate 13 by reducing the forces applied to the substrate during handling.

However, metal stiffener can be cost ineffective by occupying surface area of the substrate and thus limiting the available space for various active and passive components. Further, reliability of metal stiffener packages can be affected by the mismatch in thermal expansion coefficient (CTE) between the metal stiffener and the substrate, leading to delamination or broken electrical connections.

FIGS. 2A and 2B (Prior Art) illustrate a perspective view and a cross section view, respectively, of a prior art package stiffened by molding such as transfer molding or compression molding. The package includes a semiconductor die 11 attached to a substrate 13 through an underfill 14, together with capacitors 12. A mold may be placed to enclose the die/substrate package and a molding compound is injected. After curing, the mold is removed and molding compound is solidified to form a mold structure 20 which is adhesively bonded to the die 11 and the substrate 13, providing the necessary volume to maintain a sufficient rigidity to the molded flip chip package.

FIGS. 3A and 3B (Prior Art) illustrate a top view and a cross section view, respectively, of a variation of the prior art package stiffened by molding. A mold is placed on an empty substrate 13 (e.g., substrate before attaching the semiconductor die 11) and a molding compound is injected to form an encapsulant mold structure 30 after appropriate thermal curing. Die 11 and underfill 34 can be provided to the substrate 13 after the formation of the encapsulant mold structure 30.

DETAILED DESCRIPTION OF THE PREFERRED EMBODIMENTS

Figure 1A:
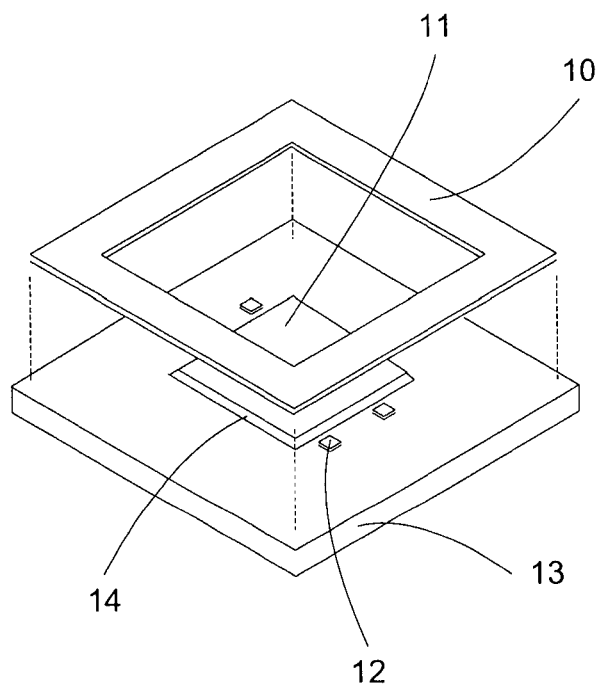
FIGS. 1A and 1B (Prior Art) illustrate a perspective view and a cross section view, respectively, of a prior art package stiffening by attaching a metal ring on a peripheral portion of the substrate.
Figure 1B:
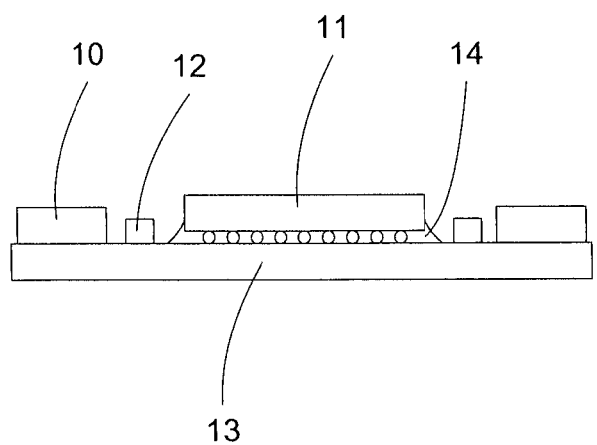
Figure 2A:
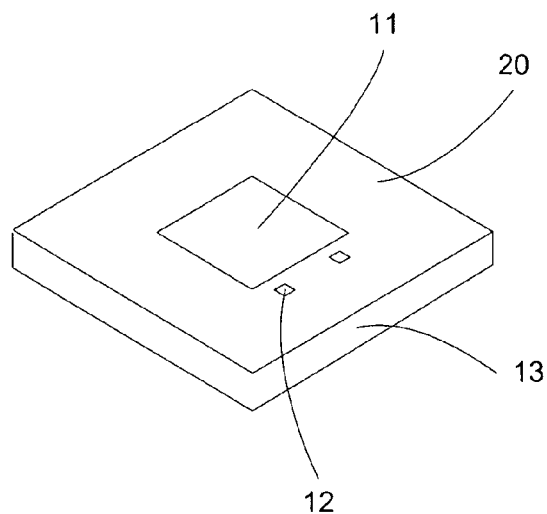
FIGS. 2A and 2B (Prior Art) illustrate a perspective view and a cross section view, respectively, of a prior art package stiffening by molding.
Figure 2B:
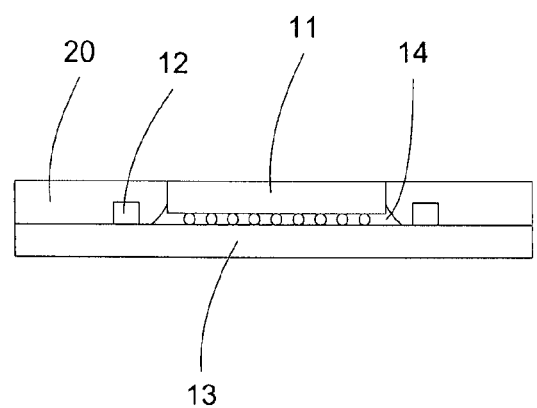
Figure 3A:
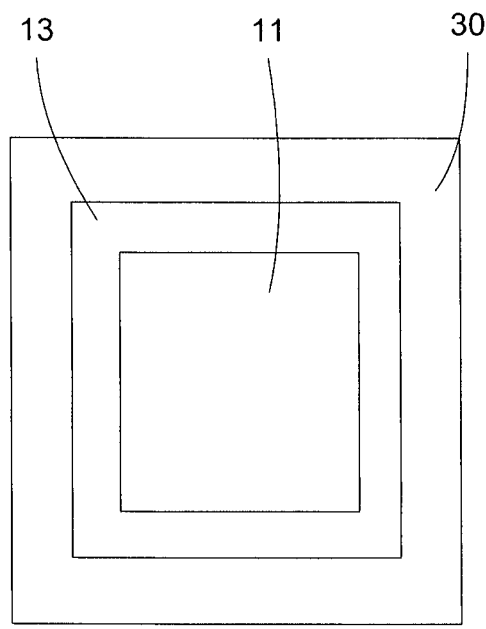
FIGS. 3A and 3B (Prior Art) illustrate a top view and a cross section view, respectively, of a variation of the prior art package stiffening by molding.
Figure 3B:
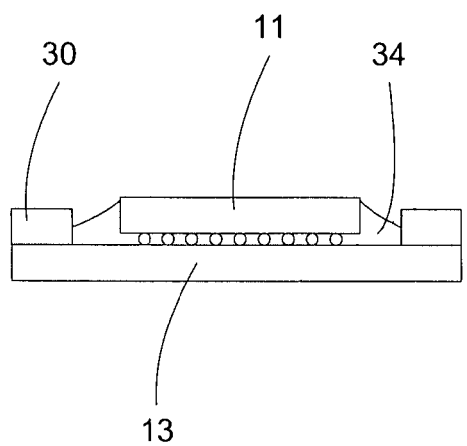

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Various operations will be described as multiple discrete operations, in turn, in a manner that is most helpful in understanding the present invention. However, the order of the description should be construed to imply that these operations are not necessarily order dependent. In particular, these operations need not be performed in the order of presentation.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive.

Embodiments of the present invention disclose an improved integrated circuit package with a curable dam stiffener structure surrounding at least an integrated circuit die on a substrate. In an embodiment, the dam stiffener structure is dispensed on thin core or coreless substrates to stiffen the substrate and to prevent warpage. A conventional thick core package substrate may include a core with a thickness between 800 and 1200 microns. Thin core substrates may include a core with a thickness between 60 and 400 microns. Coreless substrates are substrates without core.

In one embodiment, the curable dam stiffener is dispensed on the substrate before dispensing (and curing) an underfill material. The dispensing of the dam stiffener before the curing of the underfill can simplify the packaging process by allowing for the simultaneous curing of both materials, and thus eliminating a separate curing of the dam stiffener. The dam stiffener structure can also serve as a retention wall, allowing the placement of a larger quantity of underfill material in the localized area around the packaged integrated die, ensuring adequate underfill material seeping under the integrated circuit die before the curing process. In another embodiment, the dam stiffener structure allows for the placement and retention of a curable reservoir material which is dispensed after the underfill, in the space between the dam stiffener and the integrated circuit die. The reservoir material can be cured simultaneously with the dam stiffener and the underfill, or can be cured separately. The hardened reservoir layer can also serve as a substrate stiffener, providing improved overall mechanical and thermal properties of the integrated circuit package.

The dam stiffener and the reservoir layer can prevent the substrate warpage or other movement relative to the die caused by thermal cycling during package assembly, reliability testing, or field operation. Such movement may result from the different coefficients of thermal expansion (CTE) of the die and substrate materials, and may produce stress in the die or the package, causing electrical and mechanical failures.

In an embodiment, the dam stiffener can provide improved manufacturing of substrates for individual dies or substrates with a plurality of integrated circuit dies. The dam stiffener can also provide manufacturing capability for thin substrate packages to increase mechanical resistance that may be used in large scale industrialization in a cost-effective way, providing a stable surface with reduced substrate warpage.

Figure 4A:
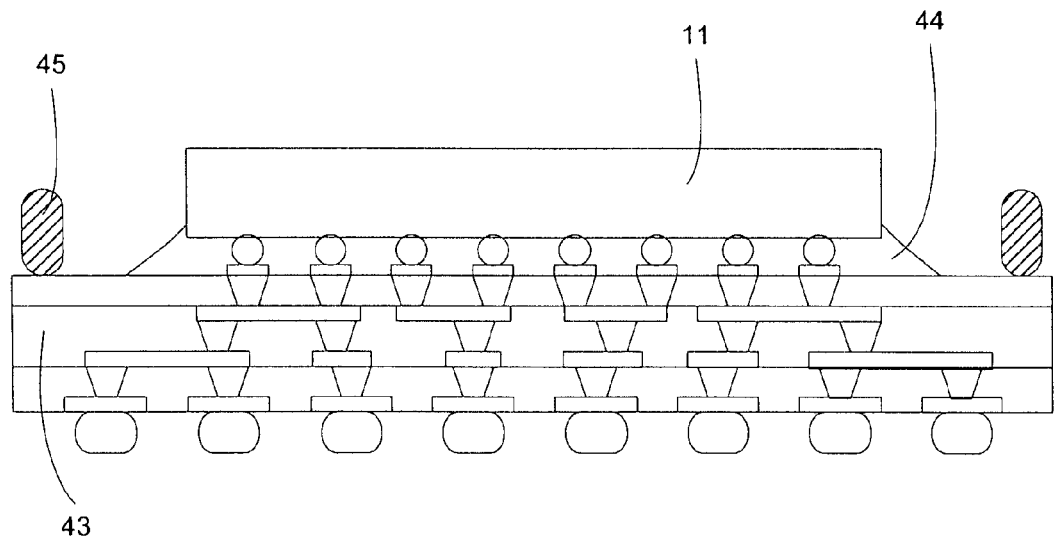
FIGS. 4A and 4B illustrate a cross section view and a top view, respectively, of an exemplary semiconductor package with improved warpage flattening for coreless or thin core substrates according to an embodiment of the present invention.
Figure 4B:
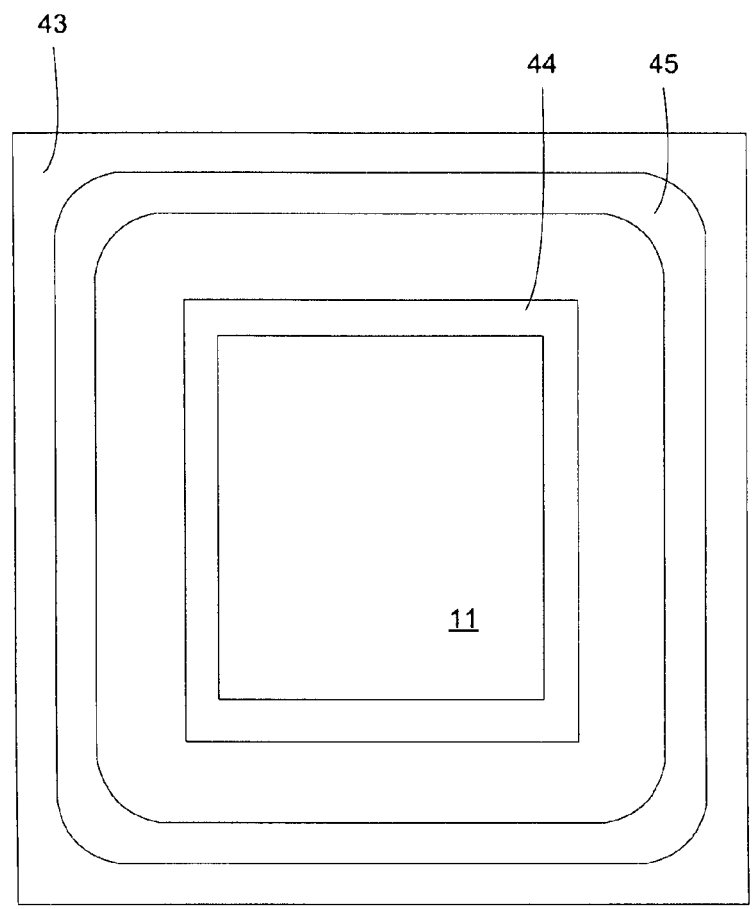

FIGS. 4A and 4B illustrate a cross section view and a top view, respectively, of an exemplary semiconductor package with improved warpage flattening for coreless or thin core substrates according to an embodiment of the present invention. A feature of at least an embodiment of the present invention includes a simultaneous curing of the dam stiffener 45 and the underfill 44.

An integrated circuit die 11 is bonded to an upper surface of a substrate 43 by a flip chip process. In an embodiment, the substrate 43 is a thin core or a coreless substrate, comprising layers of interconnections and vias, with one surface having conduction bumps for electrical connections to the bond pads of the integrated circuit die. The lower surface of the substrate comprises an array of electrical connects, such as solder balls, serving as input/output electrical connections for the package. While the above description describes an exemplary embodiment of the stiffener arrangements applied to thin core and coreless substrates in the context of an example flip chip ball grid array, embodiments of the present invention are not limited to such context, i.e., practice of the present invention may have uses with other types of chips and with other types of mounting and packaging technologies, e.g., flip chip pin grid array.

A curable polymer is dispensed along an edge of the substrate 43, and cured to form a dam stiffener 45. In embodiments of the present invention, the dam stiffener provides appropriate force to prevent bowing of the package and sufficient control to accommodate the stresses of material CTE mismatches within the semiconductor die flip chip package. As a result, the flexible semiconductor package may be more reliable. The dimensions and material of the dam stiffener is selected to provide a desired warpage control to the substrate 43, for example, the larger the width and height of the dam stiffener above the substrate, the stiffer the substrate. In an embodiment, the height of the dam stiffener is less than the top surface of the integrated circuit die 11, and higher than the bottom surface of the integrated circuit die 11. For a full thickness die of 800 microns above the substrate, the height of the dam stiffener can be about 800 microns or less. For thinner die, the dam height should decrease appropriately. In an embodiment, the dam width is about 1-2 mm, and can be more or less depending on the overall dimension of the package and the size of the die. In embodiments of the present invention, the viscosity of the dam stiffener material is higher than that of the underfill material, for example, to be able to contain the excess underfill flow. In an embodiment, the viscosity of the dam stiffener is about 0.2 Pa or higher at 110° C.

In embodiments of the present invention, the coefficient of thermal expansion (CTE) of the dam stiffener material is between 20 and 35 ppm/° C., so that the stiffness of the dam stiffener is independent of the environment temperature. Alternatively, in embodiments of the present invention, the CTE of the dam stiffener is selected to counteract a thermal warpage of the substrate, for example, by providing a convex stiffener structure for a concave substrate. In an embodiment, the CTE of the dam stiffener is higher than 3 ppm/° C., which is about the value for a typical die; and less than 20 ppm/° C., which is about the value for a typical substrate CTE.

In embodiments of the present invention, the Young's modulus of the dam stiffener material is higher than that of the underfill material to provide a desired stiffness to the substrate. In an embodiment, the value for the Young's modulus is about 14 GPa, or between 9 GPa to 20 GPa at room temperature. In embodiments of the present invention, the value for hardness is between 50 and 100 at 165° C./120 sec; the flexural modulus is between 5000 to 25000 N/mm$^2$ at 25° C.; and the flexural strength is between 50 and 200 N/mm$^2$ at 25° C. The above values form a preferred embodiment for the dam stiffener, and the actual values can be more or less, depending on the semiconductor packaging requirements.

In embodiments of the present invention, the dam stiffener comprises a thermally curable polymer, such as anhydrate, phenolic, amine, or a mixture of biphenol and amine epoxy resin. In other embodiments, fillers may be incorporated to enhance the properties of the polymer.

In embodiments of the present invention, the location of the dam stiffener is selected to provide a desired flatness to the substrate, and is preferably dispensed at the peripheral of the substrate. In an embodiment, the dam stiffener is located between the substrate edge and the die edge, and less than half way toward the substrate edge. In another embodiment, the dam stiffener is located about less than 5 mm from the substrate edges, and typically within 0.5 to 1 mm of the substrate edge. In contrast to metal or mold peripheral stiffener, the dam stiffener does not limit the number of support elements (e.g., capacitors) and does not confine the support elements to an area near the center of the substrate proximate the semiconductor die. In an embodiment, the dam stiffener can be dispensed on top of the support elements, or dispensed at a curve to avoid the support elements to maintain a height consistency.

Figure 6A:
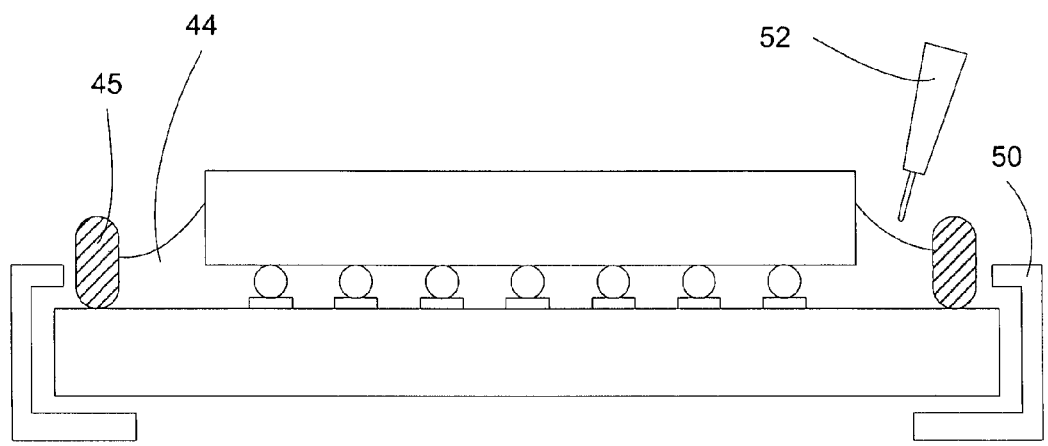
FIGS. 6A-6B illustrate an alternative process to form a semiconductor package with improved warpage flattening according to an embodiment of the present invention.

An underfill material 44 is dispensed at the edges of the integrated die 11 and allowed to seep to the space between the die and the substrate by a capillary action. In an embodiment, the underfill material is confined to the vicinity of the die edges as shown in FIG. 4A. In another embodiment, a larger amount of underfill is dispensed, spreading to the space between the die and the dam stiffener, and confined by the boundary dam stiffener (as shown in FIG. 6A). Large amount of underfill can improve the filling process, reducing the air bubbles under the integrated circuit die 11. The excess underfill can form a layer between the die and the dam stiffener, acting as an additional stiffener for the substrate. In an embodiment, the viscosity of the underfill is less than that of the dam stiffener for a more effective confinement.

In an embodiment, the dam stiffener provides a cost effective stiffening for semiconductor package manufacturing, especially for thin core or coreless substrates, e.g., substrates with core thickness less than 400 microns. The curable polymer dam stiffener can replace a metal stiffener, improving space availability and reducing thermal coefficient mismatch. The use of curable polymer can offer a large selection of material properties, from elastic modulus to coefficient of thermal expansion and viscosity, allowing ease of optimization in warpage control for semiconductor package manufacturing. The curable polymer dam stiffener can also simplify the manufacturing process, for example, by using similar polymer dispensers as in an underfill process, and by using the same curing process simultaneously with the underfill.

Figure 5A:
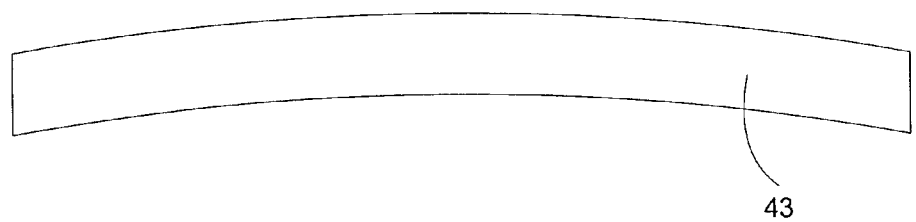
FIGS. 5A-5G illustrate an exemplary process to form a semiconductor package with improved warpage flattening according to an embodiment of the present invention.

FIGS. 5A-5G illustrate an exemplary process of forming the package stiffener according to an embodiment of the present invention. An interconnect packaging substrate 43 is provided (FIG. 5A). The substrate 43 can be a thin core or a coreless substrate, and can exhibit some warpage. The substrate 43 has been prepared for die attaching, for example, with connection pads for connection to a die on one surface and connections for package electrical connection on another surface (not shown). An exemplary substrate is shown in FIG. 4A. The thin core or coreless substrate 43, having no rigid core, is lower in stiffness and does not have sufficient rigidity as a substrate with core, exhibiting downward bending or warping, in particular at the corners.

Figure 5B:
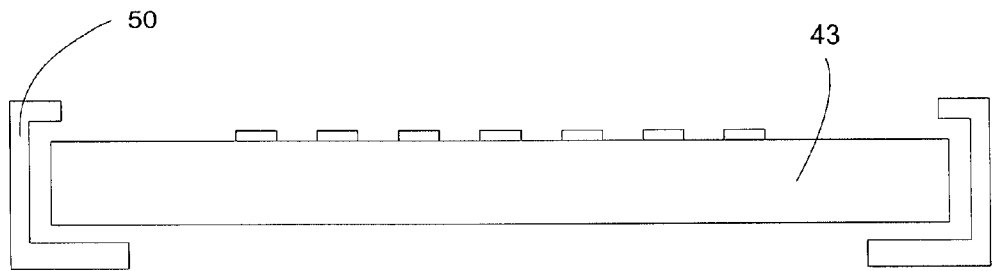

Next, the substrate 43 is flattened. In an embodiment, as shown in FIG. 5B, flattening clips 50 are used to flatten the substrate 43 to provide a flat top surface for die attachment. Other flattening means can also be used, such as restraining top plates, captive plates, clip carriers, restraint clips, or any holding mechanism. This step is optional, and is helpful for substrates that are easily bowed, such as thin core or coreless substrates, to ensure proper bonding of dies.

Figure 5C:
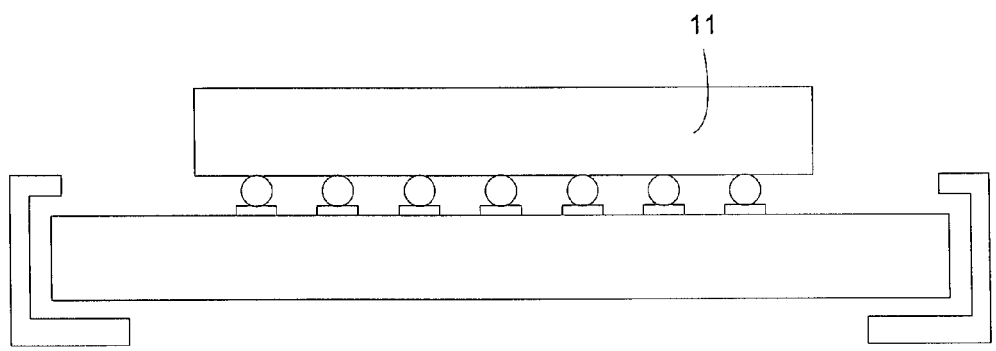

Next, integrated circuit dies are attached to the flattened substrate. In an embodiment, an integrated circuit die 11 is attached to the substrate 43 by a flip chip process with conductive bump connections (FIG. 5C). Other processes relating to die attached can be included, such as bonding, soldering and solder defluxed.

In a typical die attach operation, solder flux is generally applied prior to bonding the die to a substrate. The flux serves primarily to aid the flow of the solder, such that the solder bumps make good contact with pre-solder covered metal pads on the package substrate. After the flux is applied, the die is aligned and placed onto the substrate. The pre-solder covered metal pads are electrically connected to the electrical connections within the substrate. Heat, typically above 200° C., is applied to the die and the substrate, causing the solder bumps to alloy and form electrical connections between die and substrate. The package is then cooled to harden the connection. The remaining flux residue can be removed in a cleaning step, for instance by washing with an appropriate solvent.

Figure 5D:
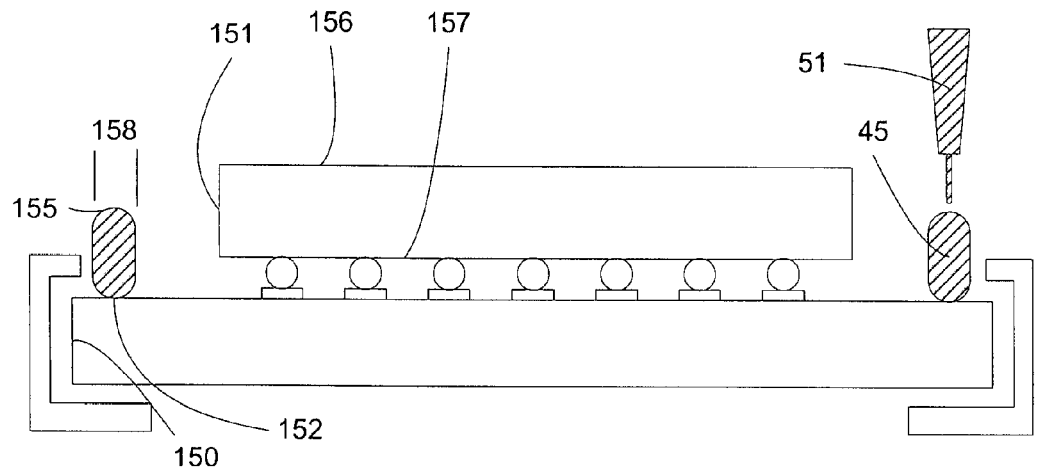

Next, a curable polymer is dispensed on the substrate 43, surrounding the integrated circuit die 11. In an embodiment, the curable polymer is dispensed by a dispenser 51 along the edges of the substrates to form a dam stiffener 45 as shown in FIG. 5D. The location and dimensions of the dam stiffener 45 is selected to provide a desired warpage control to the substrate 43. In an embodiment, the dam stiffener 45 is provided for the purpose of compensating for such low stiffness of the substrate. The stiffness, partially characterized by the material elastic modulus, and the CTE are selected to control the warpage, for example, caused by the thermal stress. In an embodiment, the dam stiffener is dispensed by a dispenser similar to the one used in dispensing underfill materials.

In an embodiment, the dam stiffener is dispensed between an edge 150 of the substrate and a corresponding edge 151 of the integrated circuit die. The location 152 of the dam stiffener is toward the substrate edge 150, less than half way between the substrate edge 150 and the die edge 151. In an embodiment, the height 155 of the dam stiffener 45 is less than a top surface 156, and more than a bottom surface 157 of the integrated circuit die 11. The width 158 of the dam stiffener is selected to provide a warpage control to the substrate. In an embodiment, the width 158 of the dam stiffener is between 1 and 5 mm. The material properties of the dam stiffener selected to provide a warpage control to the substrate. In an embodiment, the CTE of the dam stiffener is selected to counteract a thermal warpage of the substrate. In an embodiment, the CTE of the dam stiffener is between 20 and 35 ppm/° C. In an embodiment, the viscosity of the dam stiffener is about 0.2 Pa at 110° C. In another embodiment, the viscosity of the dam stiffener is between 0.04 and 0.2 Pa. In an embodiment, the elastic modulus or the Young's modulus of the dam stiffener is about 14 GPa, or between 5 and 20 GPa.

Figure 5E:
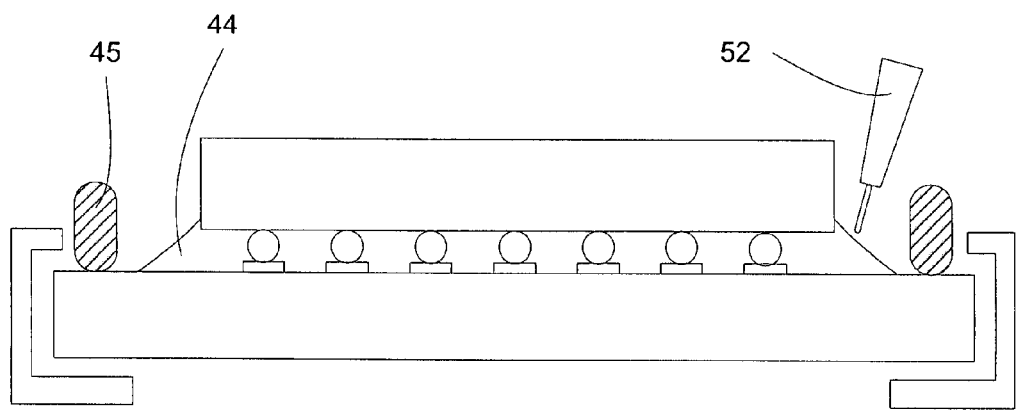

Next, an underfill material 44 is dispensed in the space between the integrated circuit die and the substrate. In an embodiment, an underfill material 44 is dispensed by a dispensed 52 near the edges of the substrate 11 as shown in FIG. 5E. The underfill material is seeping to the space between the die 11 and the substrate 43, flowing around the conductive bumps by a capillary, vacuum or suction action. In embodiments of the present invention, the viscosity and the elastic modulus of the underfill material is lower than that of the dam stiffener. In an embodiment, the viscosity of the underfill material is between 0.04 to 0.15 Pa at 110° C. In an embodiment, the elastic modulus of the underfill material is between 8 and 12 Pa at 25° C. In an embodiment, the CTE of the underfill material is similar to that of the dam stiffener. In an embodiment, the CTE of the underfill material is between 25 and 32 ppm/° C.

Underfilling is a well known technique to reduce thermo-mechanical stress in flip-chip attachments. Underfilling includes introducing an underfill material, typically in the form of a viscous adhesive liquid such as epoxy resin, between the die and the substrate after the die is attached to the substrate. This reduces the stress on the solder bumps, thereby improving the package's reliability. In an embodiment, the underfill can be conventional underfill materials, or can be specifically tailored with material properties similar to those of the dam stiffener.

Currently, the most common technique for applying underfill to a flip chip is to dispense the underfill material with a needle dispenser along one or more edges of the die and to rely upon capillary action or vacuum or suction force to cause the underfill material to flow beneath the die and around the conductive bumps. The epoxy resin underfill is typically injected at a pressure of around 1-5 MPa. The resin may be preheated to an intermediate temperature to lower the viscosity of the resin and facilitate the resin flow process. To prevent the formation of voids in the gap, many passes of dispense and seep sequence might be needed to form clean void free underfill structures.

Figure 5F:
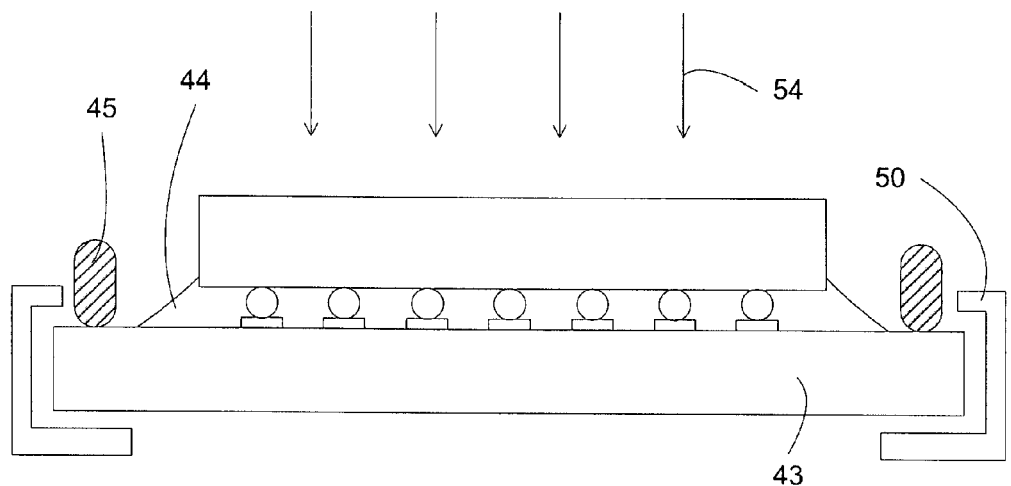

Next, the dam stiffener 45 and the underfill material 44 are simultaneously cured. In an embodiment, the package is subjected to a heat source 54 to simultaneously cure the damp stiffener 45 and the underfill 44 as shown in FIG. 5F. The dam stiffener and the underfill are typically cured by heating the substrate and die to an appropriate curing temperature, generally between 100 to 200° C. for a specific amount of time. Depending on the properties of the curable polymers forming the dam stiffener and the underfill, different curing profiles may be specified that provide suitable results. In an embodiment, the underfill and the dam stiffener have similar curing profiles to enable a simultaneous curing process. In this manner, the process produces an electrically and mechanically bonded semiconductor chip assembly, with the dam stiffener and the underfill material providing an improved planarity for the semiconductor package. The dam stiffener can compensate for the potential warpage of the substrate, for example, during the cooling down from the cure temperature to the room temperature, largely due to the CTE mismatch between the substrate and the die.

Figure 5G:
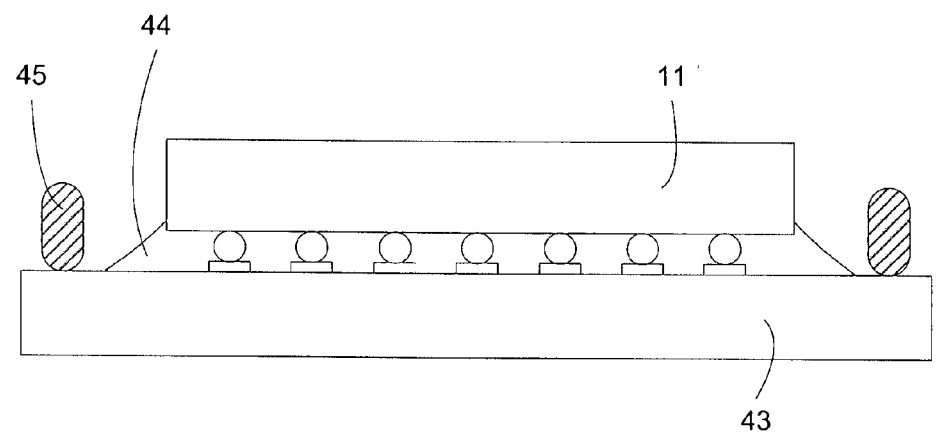

Next, additional processes are performed to complete the assembly process. In an embodiment, the flattening clips are removed, and the substrate 43 remains flat partially due to the dam stiffener 45 as shown in FIG. 5G. An optional heat spreader composed of a high thermal conductivity can be connected to the back surface of the integrated circuit die.

The above process to form the semiconductor package is an exemplary process, and process variations are within the scope of the present invention. For example, the underfill 44 can be dispensed before dispensing the dam stiffener 45, the dam stiffener 45 can be dispensed before attaching the die 11, or separate thermal curing can be performed for the dam stiffener 45 and the underfill 44.

Figure 6B:
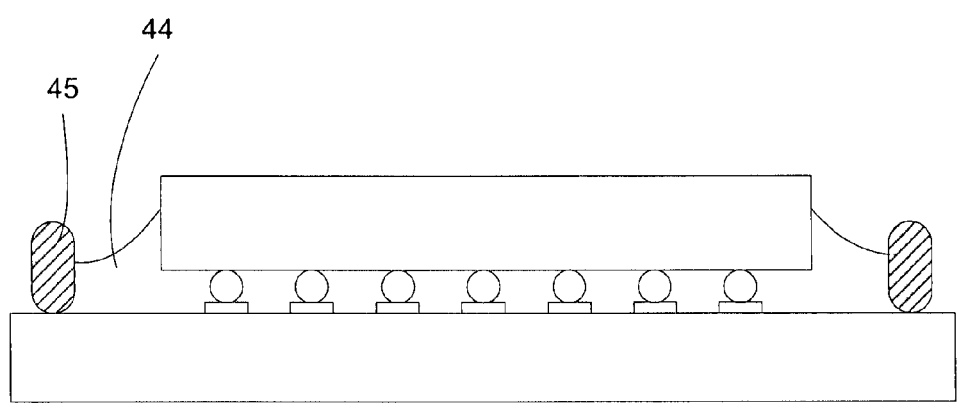

FIGS. 6A-6B illustrate an exemplary variation of the above process, according to an embodiment of the present invention. After attaching the die 11 and dispensing the dam stiffener 45 as shown in FIG. 5D, the process continues with dispensing a thick underfill material. In an embodiment, a thick underfill 44 is dispensed by a dispenser 52 as shown in FIG. 6A. A larger amount of underfill is dispensed, as compared to that of FIG. 5E, filling the space between the die 11 and the dam stiffener 45. The large amount of underfill can help reducing the number of underfill applications in the localized area around the integrated circuit die 11. Further, the thick underfill layer can also help stiffening the substrate. FIG. 6B shows the final semiconductor package, after curing the dam stiffener 45 and the underfill 44, simultaneously or separately, and removing the flattening clips 50.

Figure 7:
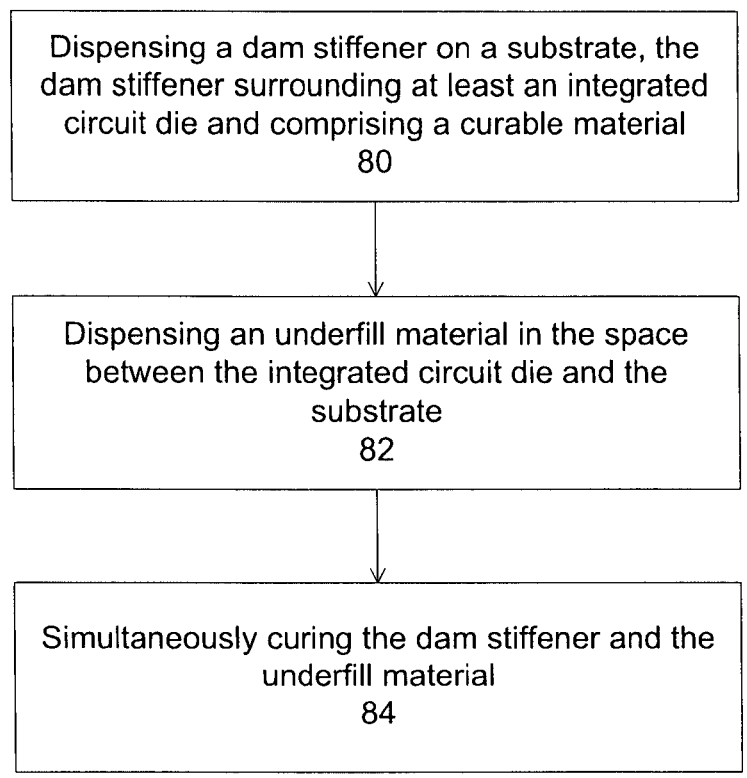
FIGS. 7-8 illustrate exemplary process flows to form a semiconductor package with improved warpage flattening according to an embodiment of the present invention.

FIG. 7 illustrates an exemplary process flow according to an embodiment of the present invention. In block 80, a dam stiffener is dispensed on a substrate, with the dam stiffener surrounding at least an integrated circuit die and comprising a curable polymer. The term "dam stiffener" used in this context means either a curable polymer forming an uncured dam stiffener, an uncured dam stiffener, or the hardened cured dam stiffener. Thus this process can be described as dispensing a curable polymer on a substrate, surrounding at least an integrated circuit die to form an uncured dam stiffener. In block 82, an underfill material is dispensed in the space between the integrated circuit die and the substrate. Practically, an underfill material is dispensed outside and near the edges of the integrated die, and is driven to the space under the integrated circuit die by a capillary or vacuum action. In an embodiment, the underfill can be minimumly dispensed to completely fill the gap between the die and the substrate, with minimum exposed portion outside the die edge. In another embodiment, the underfill can form a thick underfill layer, dispensed generously to also fill the space between the dam stiffener and the die edges. The term "underfill" used in this context also means a curable polymer serving in an underfill process, an uncured underfill layer, or a cured underfill layer. Next is the stiffening process of the dam stiffener. In block 84, the dam stiffener and the underfill material are simultaneously cured. In an embodiment, the curable polymer forming the dam stiffener and the curable polymer forming the underfill layer are having similar curing characteristics, so that one heat treatment process can cure both materials to the desired properties.

Figure 8:
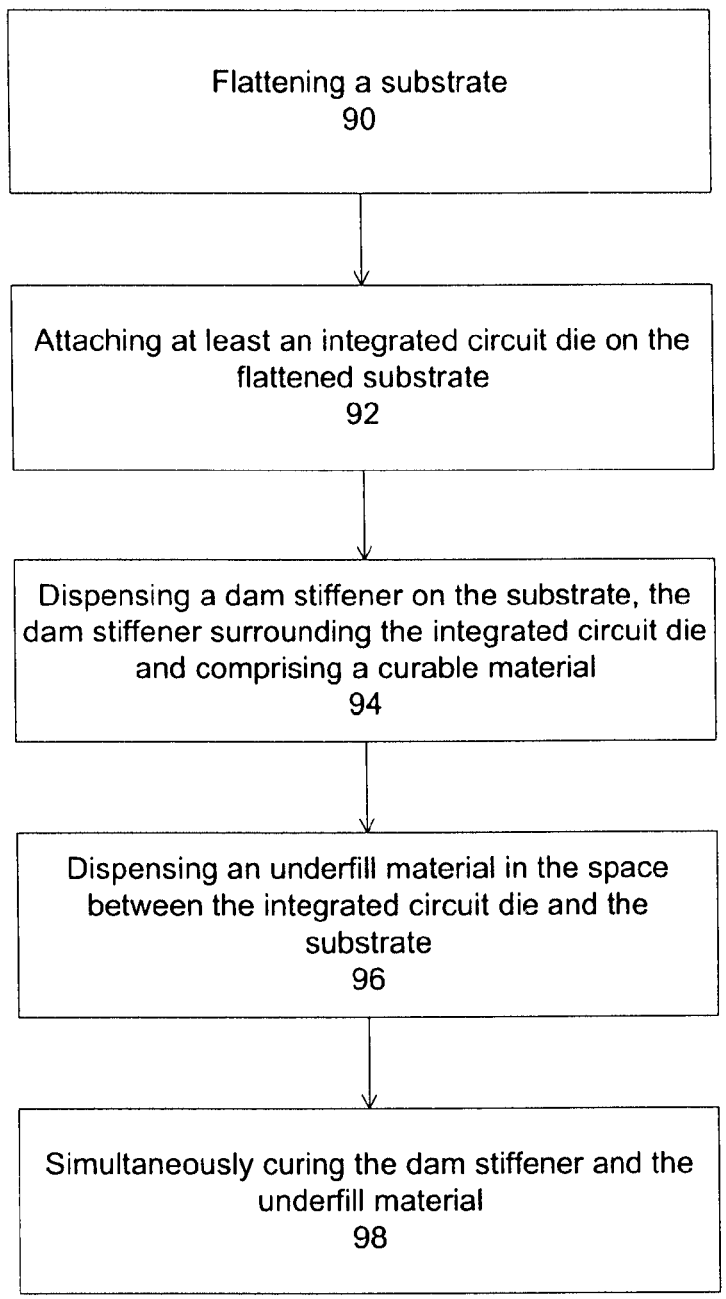

FIG. 8 illustrates an exemplary process flow according to another embodiment of the present invention. A substrate is provided, and if the substrate is bowed, the substrate is flattened (block 90), for example, by using flattening clips, restraining top plates, etc. In block 92, at least an integrated circuit die is attached on the flattened substrate, for example, by a flip chip bonding process, together with soldering and solder defluxing. In block 94, a dam stiffener is dispensed on the substrate, with the dam stiffener surrounding at least an integrated circuit die and comprising a curable polymer. In block 96, an underfill material is dispensed in the space between the integrated circuit die and the substrate. In an embodiment, the underfill can be minimumly dispensed to completely fill the gap between the die and the substrate, with minimum exposed portion outside the die edge. In another embodiment, the underfill can form a thick underfill layer, dispensed generously to also fill the space between the dam stiffener and the die edges. In block 96, the dam stiffener and the underfill material are simultaneously cured.

Figure 9A:
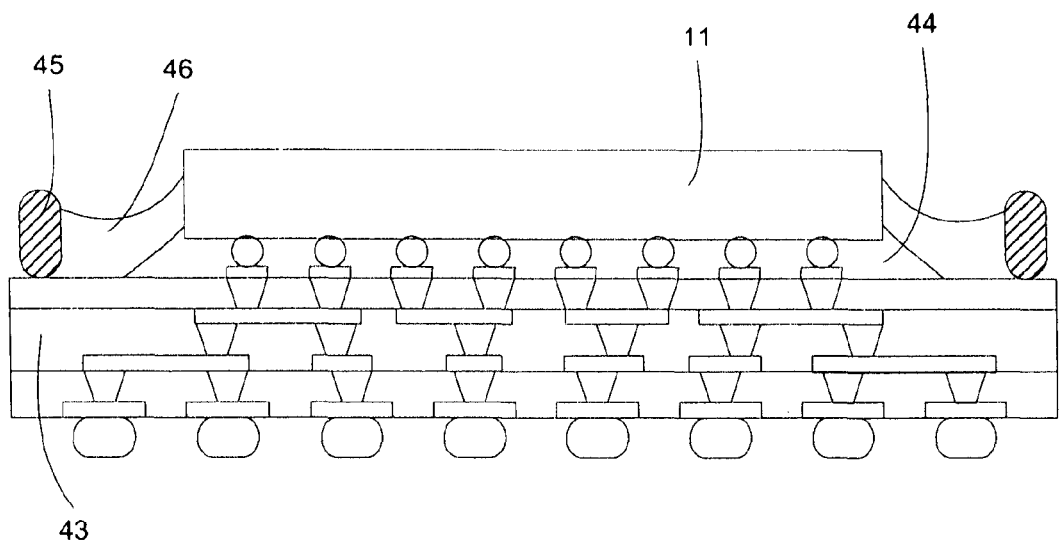
FIGS. 9A and 9B illustrate a cross section view and a top view, respectively, of an exemplary semiconductor package with improved warpage flattening for coreless or thin core substrates according to another embodiment of the present invention.
Figure 9B:
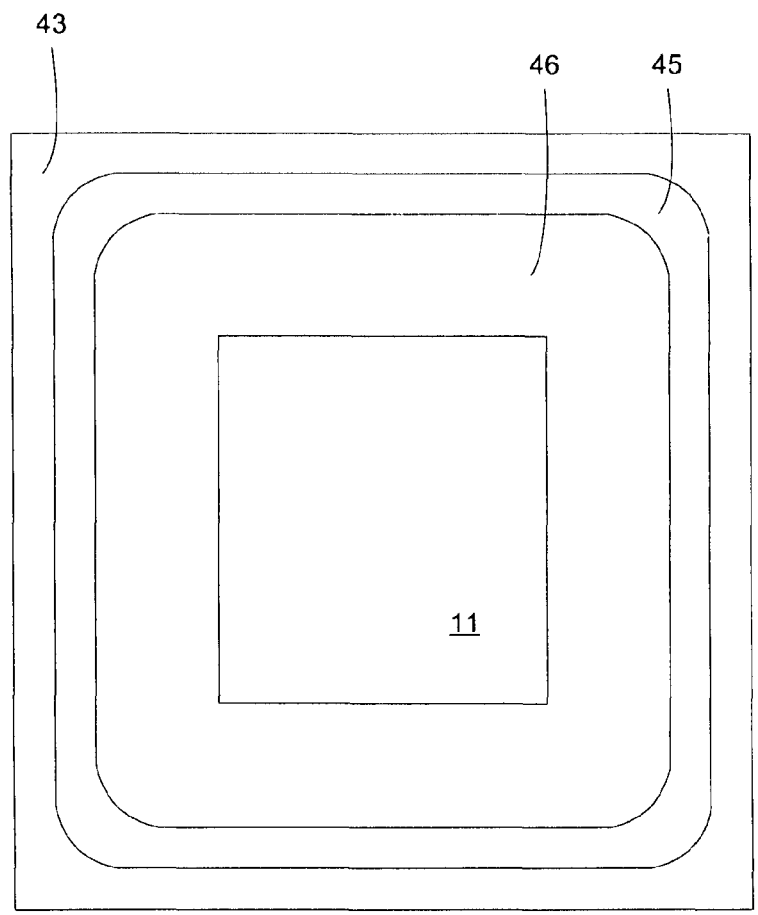

FIGS. 9A and 9B illustrate a cross section view and a top view, respectively, of an exemplary semiconductor package according to another embodiment of the present invention. A feature of at least an embodiment of the present invention includes a curable reservoir layer 46, serving as an encapsulant layer and acting as a stiffener, in addition to the dam stiffener 45.

An integrated circuit die 11 is bonded to a substrate 43 through an underfill layer 44, with a dam stiffener 45 dispensed surrounding the die 11. A reservoir layer, comprising a curable polymer, is dispensed in the space between the dam stiffener 45 and the die 11, and on top of the portion of the underfill 44 outside the die 11. The reservoir layer can act as an encapsulating layer, and also can act as an additional stiffener for the substrate.

The dimensions and material of the reservoir is selected to provide a desired warpage and/or encapsulate control to the substrate 43. In an embodiment, the height of the reservoir is less than the top surface of the integrated circuit die 11 or the height of the dam stiffener. In an embodiment, the viscosity of the reservoir material is lower than that of the dam stiffener to be able to be confined within the dam stiffener. In an embodiment, the viscosity of the reservoir material is between 0.15 to 0.2 Pa. In an embodiment, the coefficient of thermal expansion (CTE) of the reservoir material is less than 15 ppm/° C., so that the stiffness of the reservoir is independent of the environment temperature. In another embodiment, the CTE of the reservoir material is similar to that of the underfill material. In another embodiment, the CTE of the reservoir can be selected to counteract a thermal warpage of the substrate, for example, providing a convex stiffener structure for a concave substrate. In an embodiment, the elastic modulus of the reservoir material is higher than that of the underfill material to provide a desired stiffness to the substrate. In an embodiment, the elastic modulus of the reservoir material is between 12-15 GPa. In embodiments of the present invention, the material properties of the reservoir materials are within the ranges of the dam stiffener. For example, the curing profile of the reservoir is similar to those of the dam stiffener and the underfill to enable a simultaneous curing process.

Figure 10A:
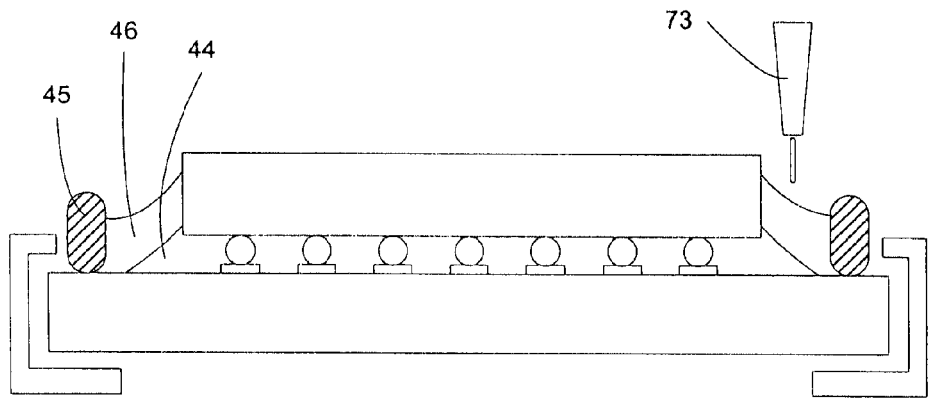
FIGS. 10A-10C illustrate an exemplary process to form a semiconductor package with improved warpage flattening according to another embodiment of the present invention.
Figure 10B:
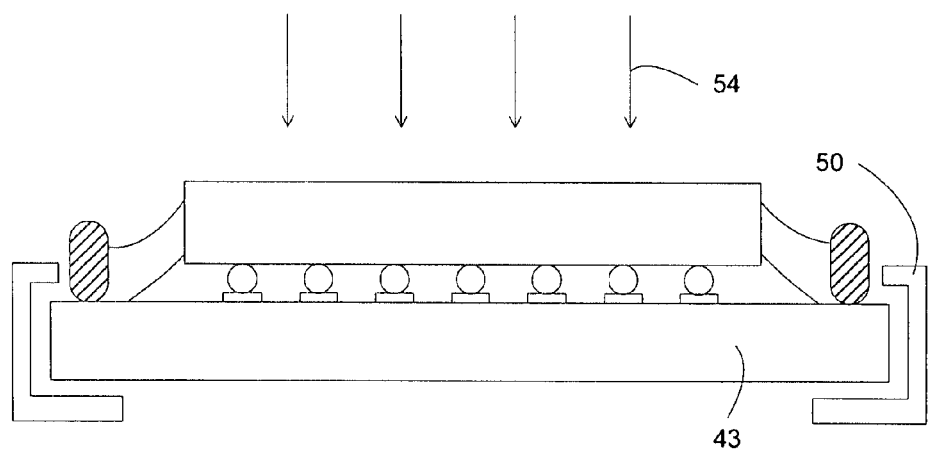
Figure 10C:
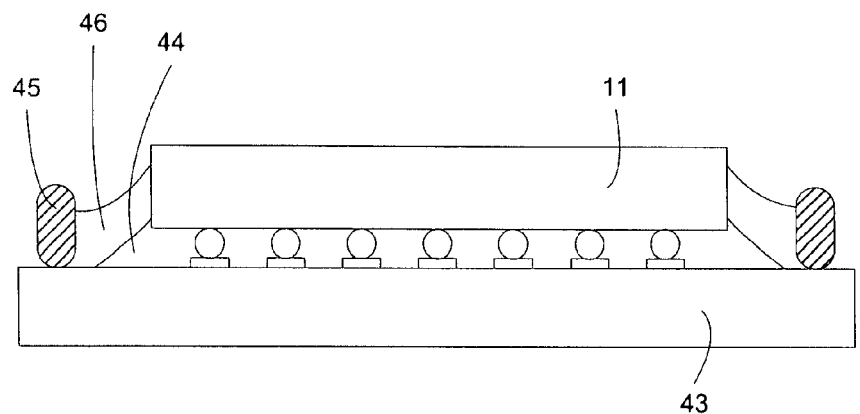

FIGS. 10A-10C illustrate an exemplary process, according to an embodiment of the present invention. After attaching the integrated circuit die 11, dispensing the dam stiffener 45 and thin underfill material 44 as shown in FIG. 5E, the process continues with dispensing a curable reservoir material between the dam stiffener and the integrated circuit die. In an embodiment, a curable reservoir layer 46 dispensed by a dispenser 73 as shown in FIG. 10A. A larger amount of reservoir material is dispensed, effectively filling the space between the die 11 and the dam stiffener 45. The reservoir layer is dispensed after and on top of the underfill material 44. The thick reservoir layer 46 can help stiffening the substrate 43.

Next, the dam stiffener, the underfill material and the reservoir material are cured. In an embodiment, the package is subjected to a heat cure, simultaneously curing the dam stiffener 45, the underfill 44, and the reservoir 46. In another embodiment, separate curing processes can be performed.

Next, final preparations for the package can be performed. In an embodiment, the flattening clips 50 are removed, showing the package in FIG. 10C.

Figure 11:
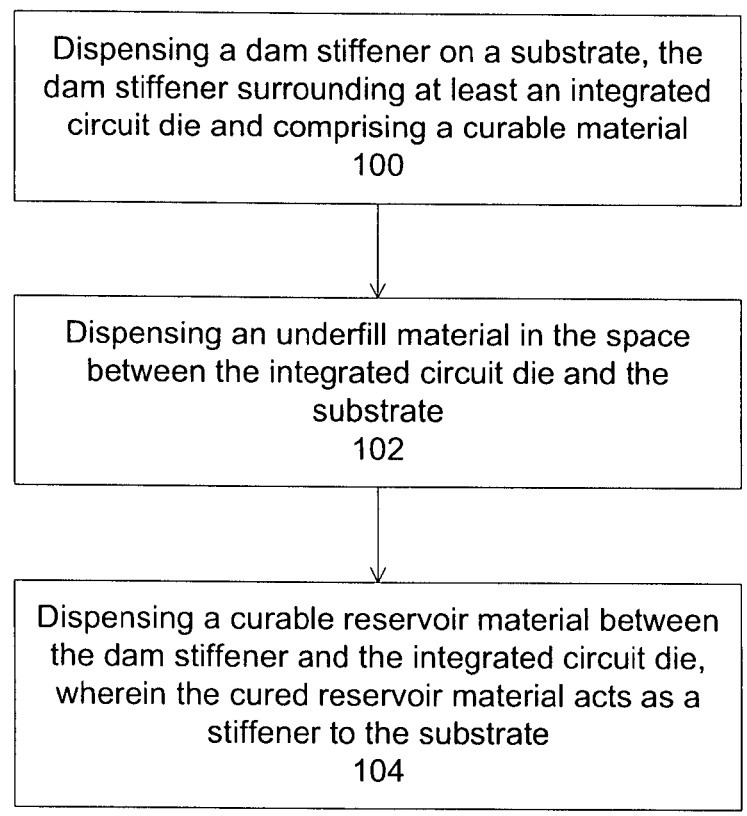
FIGS. 11-12 illustrate exemplary process flows to form a semiconductor package with improved warpage flattening according to another embodiment of the present invention.

FIG. 11 illustrates an exemplary process flow according to an embodiment of the present invention. In block 100, a dam stiffener is dispensed on a substrate, with the dam stiffener surrounding at least an integrated circuit die and comprising a curable polymer. In block 102, an underfill material is dispensed in the space between the integrated circuit die and the substrate. In an embodiment, the underfill can be minimumly dispensed to completely fill the gap between the die and the substrate, with minimum exposed portion outside the die edge. In another embodiment, the underfill can form a thick underfill layer, dispensed generously to also fill the space between the dam stiffener and the die edges. In block 104, a curable reservoir material is dispensed between the dam stiffener and the integrated circuit die, wherein the cured reservoir layer acts as a stiffener to the substrate.

Figure 12:
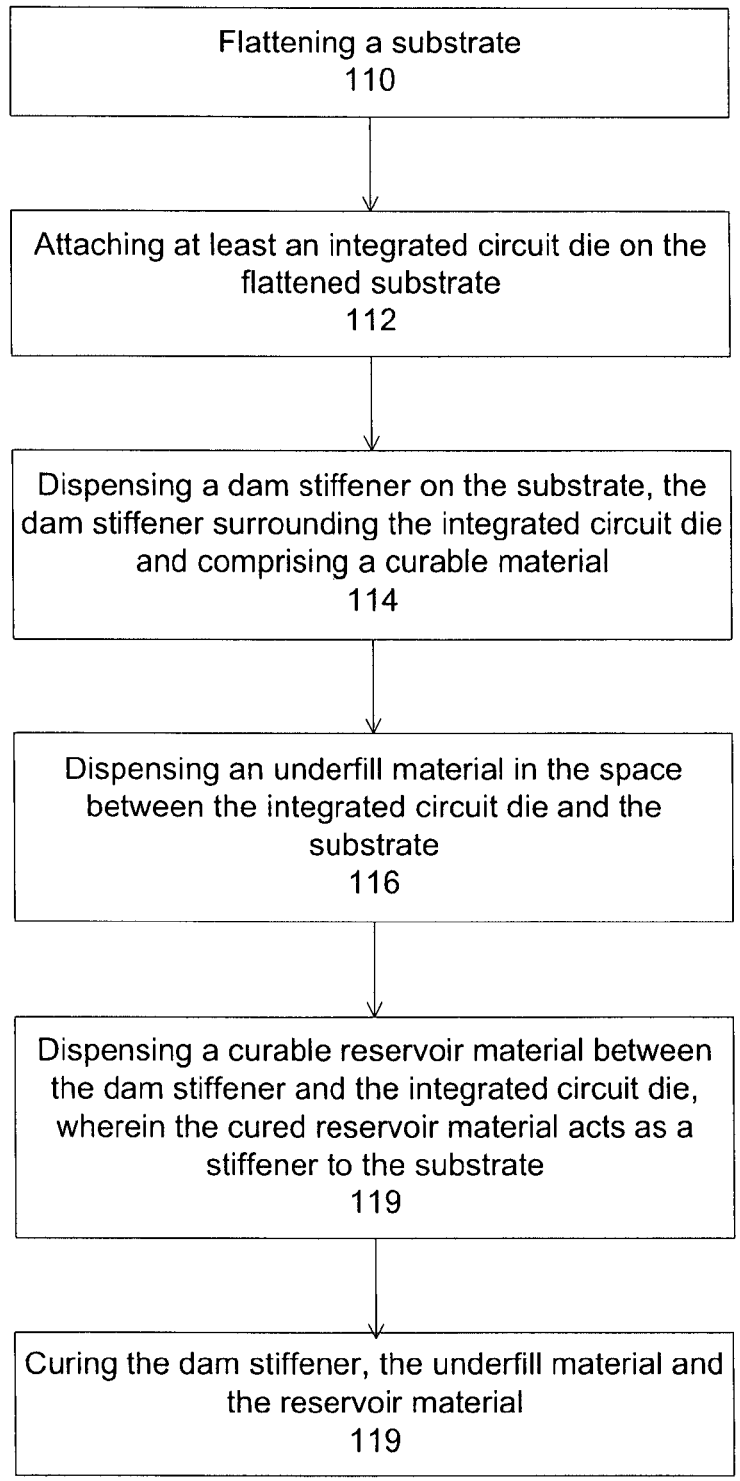

FIG. 12 illustrates an exemplary process flow according to another embodiment of the present invention. In block 110, a substrate is flattened. In block 112, at least an integrated circuit die is attached on the flattened substrate. In block 114, a dam stiffener is dispensed on the substrate, with the dam stiffener surrounding at least an integrated circuit die and comprising a curable polymer. In block 116, an underfill material is dispensed in the space between the integrated circuit die and the substrate. In an embodiment, the underfill can be minimumly dispensed to completely fill the gap between the die and the substrate, with minimum exposed portion outside the die edge. In another embodiment, the underfill can form a thick underfill layer, dispensed generously to also fill the space between the dam stiffener and the die edges. In block 118, a curable reservoir material is dispensed between the dam stiffener and the integrated circuit die, wherein the cured reservoir layer acts as a stiffener to the substrate. In block 119, the dam stiffener, the underfill, and the reservoir materials are cured, either simultaneously or separately.

The foregoing description of the preferred embodiments is provided to enable any person skilled in the art to make or use the present invention. Various modifications to these embodiments are possible, and the generic principles presented herein may be applied to other embodiments as well. For instance, a dam stiffener element may take on any dispensable shape, such as rectangular, circular, trapezoidal, or irregular.

As such, the present invention is not intended to be limited to the embodiments shown above but rather is to be accorded the widest scope consistent with the principles and novel features disclosed in any fashion herein.

What is claimed is:

1. An integrated circuit package comprising:
   a substrate;
   a die coupled to said substrate;
   an underfill material between said die and said substrate and having an underfill portion extending outside of said die;
   a dam stiffener comprising a curable material surrounding said die wherein said dam stiffener has a flexural modulus between 5000-25000 N/mm$^2$; and
   a reservoir material comprising a curable material disposed between the dam stiffener and the die and on top of said underfill portion extending outside of said die, wherein the reservoir material has an elastic modulus between 12-15 GPa.

2. The integrated circuit package of claim 1 wherein the reservoir material has a CTE of less than 15 ppm/° C.

3. The integrated circuit package of claim 1 a wherein said dam stiffener is more viscous than said underfill material prior to curing said stiffener and said underfill material.

4. The integrated circuit package of claim 1 wherein the dam stiffener has a Young's modulus which is higher than the Young's modulus of said underfill material.

5. The integrated circuit package of claim 1 wherein said dam stiffener is located toward a substrate edge of said substrate and less than half way between said substrate edge and said die.

6. The integrated circuit package of claim 1 wherein said die has a top surface opposite a bottom surface wherein said bottom surface is coupled to said substrate and wherein said dam stiffener has a height less than said top surface and greater than said bottom surface.

7. The semiconductor package of claim 1 wherein said substrate is a thin non-rigid substrate and wherein said dam stiffener provides an appropriate force to prevent bowing of said package.

8. The integrated circuit package of claim 1 wherein said substrate is selected from the group consisting of a thin core substrate and a coreless substrate.

9. The integrated circuit package of claim 1 wherein said dam stiffener has a width between 1 and 5 mm.

10. The integrated circuit package of claim 1 wherein said reservoir material extends from a die edge to said dam stiffener.

11. An integrated circuit package comprising:
- a coreless or thin core substrate having a core thickness less than 400 microns;
- a die having a top surface and a bottom surface, said bottom surface electrically connected to said substrate;
- an underfill material located between said die bottom surface and said substrate and having a underfill portion extending outside of said die;
- a dam stiffener comprising a curable material surrounding said die and spaced apart from said die wherein said dam stiffener has a flexural modulus between 5000-25000 N/mm$^2$, wherein said dam stiffener has a Young's modulus which is larger than the Young's modulus of said underfill material; and
- a reservoir material comprising a curable material disposed between the dam stiffener and the die and on top of said underfill portion extending outside of said die wherein the reservoir material has an elastic modulus between 12-15 GPa.

12. The integrated circuit package of claim 11 wherein said reservoir material has a CTE of less than 15 ppm/° C.

13. The integrated circuit package of claim 11 wherein said dam stiffener has a height less than said top surface and greater than said bottom surface.

14. The integrated circuit package of claim 11 wherein said dam stiffener has a width between 1 and 5 mm.

15. The integrated circuit package of claim 11 wherein said reservoir material extends from a die edge to said dam stiffener.

* * * * *